(12) United States Patent
Lam et al.

(10) Patent No.: US 12,149,044 B2
(45) Date of Patent: Nov. 19, 2024

(54) FLIP-CHIP OPTOELECTRONIC DEVICE

(71) Applicant: DENSELIGHT SEMICONDUCTORS PTE LTD, Singapore (SG)

(72) Inventors: Yee Loy Lam, Singapore (SG); Hon Yuen Aaron Sim, Singapore (SG); Lay Cheng Choo, Singapore (SG); Long Cheng Koh, Singapore (SG)

(73) Assignee: DENSELIGHT SEMICONDUCTORS PTE LTD, Singapore (SG)

( * ) Notice: Subject to any disclaimer, the term of this patent is extended or adjusted under 35 U.S.C. 154(b) by 528 days.

(21) Appl. No.: 17/648,371

(22) Filed: Jan. 19, 2022

(65) Prior Publication Data
US 2022/0231477 A1 Jul. 21, 2022

Related U.S. Application Data

(60) Provisional application No. 63/139,679, filed on Jan. 20, 2021.

(51) Int. Cl.
| | | |
|---|---|---|
| *H01S 5/0234* | (2021.01) | |
| *H01S 5/023* | (2021.01) | |
| *H01S 5/0237* | (2021.01) | |
| *H01S 5/024* | (2006.01) | |

(52) U.S. Cl.
CPC ............ *H01S 5/0234* (2021.01); *H01S 5/023* (2021.01); *H01S 5/0237* (2021.01); *H01S 5/02461* (2013.01)

(58) Field of Classification Search
CPC .................................................. H01S 5/02461
See application file for complete search history.

(56) References Cited

U.S. PATENT DOCUMENTS

| | | | | |
|---|---|---|---|---|
| 2015/0028376 A1* | 1/2015 | Corwin | ................... | H01L 33/62 438/22 |
| 2015/0340841 A1* | 11/2015 | Joseph | ................ | H01S 5/04257 372/50.12 |

* cited by examiner

*Primary Examiner* — Tuan N Nguyen
(74) *Attorney, Agent, or Firm* — CHIP LAW GROUP

(57) ABSTRACT

An optoelectronic device includes a semiconductor die that includes a substrate layer, a laser diode, first and second conducting pads, a cathode pad, an anode pad, and a passivation layer. The laser diode and the conducting pads are formed on the substrate layer. The formation of the conducting pads directly on the substrate layer offers an increased area for heat dissipation. The cathode pad is formed on the first conducting pad whereas the anode pad is formed above the second conducting pad. The passivation layer is formed above the laser diode. The attachment of the semiconductor die to a submount of the optoelectronic device occurs by way of the cathode pad and the anode pad. After the attachment, a free space is created directly between the passivation layer and the submount to reduce the impact of solder bonding stress on the laser diode.

20 Claims, 13 Drawing Sheets

FLIP-CHIP OPTOELECTRONIC DEVICE

REFERENCE

This Patent Application makes reference to, claims priority to, claims the benefit of U.S. provisional application 63/139,679 filed Jan. 20, 2021.

FIELD

Various embodiments of the disclosure relate generally to optoelectronic devices. More particularly, various embodiments of the present disclosure relate to flip-chip optoelectronic devices.

BACKGROUND

Edge-emitting laser diodes used for datacom and sensing applications are conventionally fabricated with epitaxially grown active laser core on III-V compound semiconductor substrates. The active laser core includes a diode P-N junction and a laser waveguide. The light emission is from either one end or both ends of the laser waveguide. The device is grown with an anode or P-contact located at a top of the epitaxial stack of the laser diode or with a cathode or N-contact located at the top of the epitaxial stack of the laser diode.

With the advent of Silicon Photonics (SiPh) to enable integrated photonics, SiPh has been typically deployed in several photonics integrated circuit applications. However, the challenge faced with SiPh is that as silicon is not a direct-bandgap material, it does not emit light from electrical current injection. Therefore, direct-bandgap devices such as laser diodes, semiconductor-optical-amplifiers, waveguided photodetectors, or the like, are integrated in a hybrid manner onto the SiPh platform.

In some cases, the hybrid integration is achieved by packaging the laser diode die in a separate Laser Micro-Package (LMP), and the LMP is subsequently bonded on the SiPh platform such that the light emitted from the laser diode is transmitted over free-space and coupled into the SiPh waveguides via grating coupling. However, the preferred approach for hybrid integration is by direct flip-chip bonding of the laser diode die onto the Silicon Photonics such that the light emitted from the edge-emitting laser diode is aligned to and butt-coupled to the SiPh waveguides. In the LMP packaging, the laser diode is mounted with the junction-side up, i.e., the backside of the die's substrate is bonded on the receiving submount. Such junction-up bonding is also commonly employed in the datacom and sensing application industries, such as in their packaging in the TO-can or Butterfly cases.

To adapt such laser diodes for direct flip-chip bonding, it would be necessary to augment the device with additional features on the die such as alignment marks, Z-stops, and patterning the laser diode bond pads to match the geometry of the receiving solder pads on the SiPh wafer. However, the conventional adaption of the junction-up laser diode for flip-chip assembly has many drawbacks. For example, the main channel for heat dissipation of the laser diode is compromised upon flip-chip assembly, which results in impairment in the efficiency of the functioning of the laser diode. Further, an added impact of the solder bonding stress impairs the laser core function.

Further limitations and disadvantages of conventional and traditional approaches will become apparent to one of skill in the art through comparison of such systems with some aspects of the present disclosure as set forth in the remainder of the present application with reference to the drawings

BRIEF DESCRIPTION OF THE DRAWINGS

The accompanying drawings illustrate the various embodiments of systems, methods, and other aspects of the disclosure. It will be apparent to a person skilled in the art that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another and vice versa.

Various embodiments of the present disclosure are illustrated by way of example, and not limited by the appended figures, in which like references indicate similar elements.

DETAILED DESCRIPTION

Figure 1:
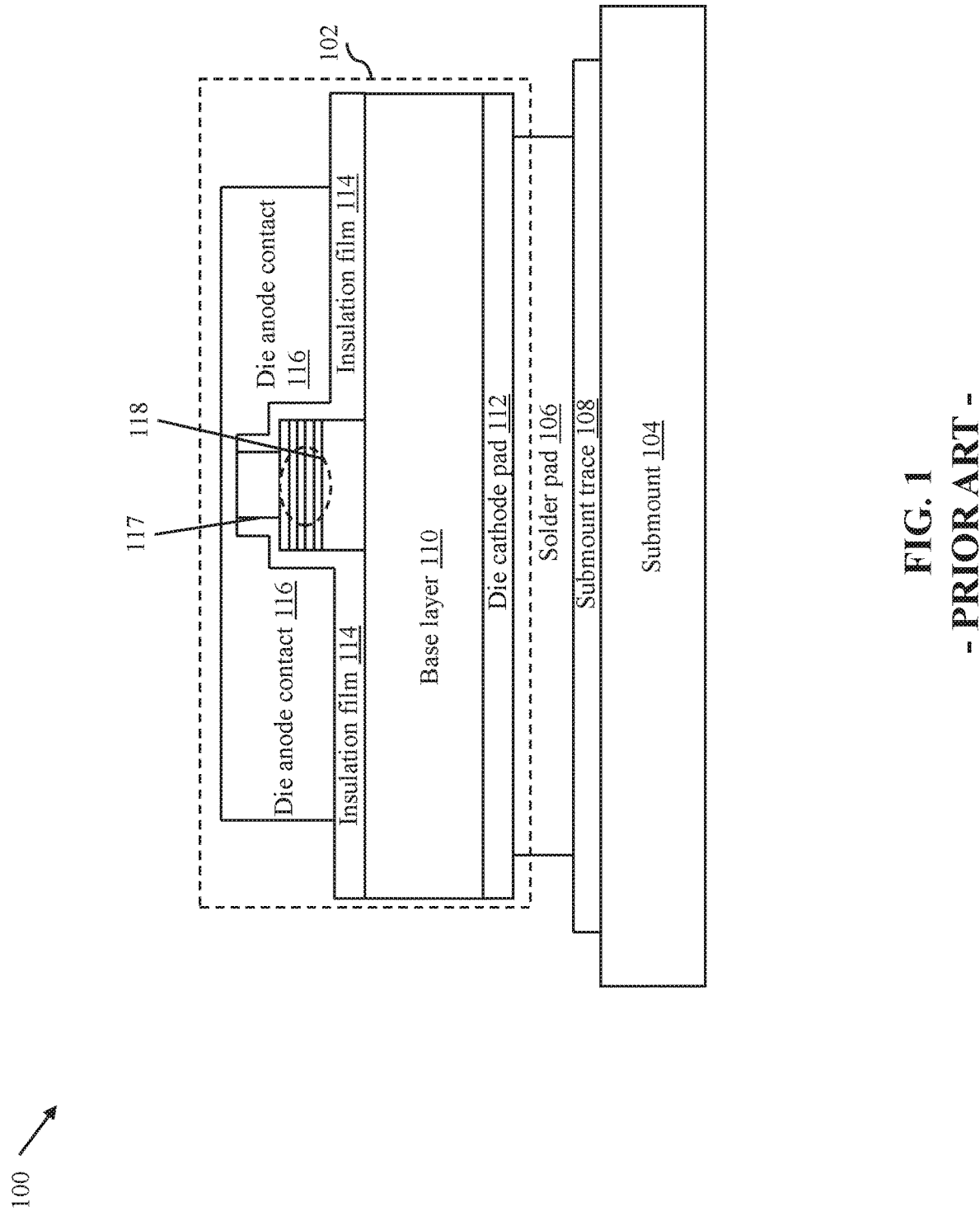
FIG. 1 is a schematic diagram that illustrates a conventional junction-up mounting of a semiconductor die on a submount.

Contact pads for flip-chip optoelectronic devices are provided substantially as shown in, and described in connection with, at least one of the figures.

In an embodiment, an optoelectronic device in accordance with an embodiment of the present disclosure is disclosed. The optoelectronic device comprises a semiconductor die and a submount. The semiconductor die comprises a substrate layer and a laser diode. The laser diode is formed on the substrate layer. The semiconductor die further comprises a first conducting pad and a second conducting pad that are formed on the substrate layer, a first passivation layer, a first cathode pad, an anode pad, and a second passivation layer. The first passivation layer is formed on the second conducting pad and between (i) the first conducting pad and the laser diode and (ii) the second conducting pad and the laser diode. The first cathode pad is formed on the first conducting pad. The anode pad is formed above a first region of the first passivation layer. The first region of the first passivation layer is formed on the second conducting pad. The second passivation layer is formed above the laser diode, and isolates the first cathode pad and the anode pad. The semiconductor die is coupled to the submount in a flip-chip configuration by way of the anode pad and the first cathode pad such that a free space is created directly between the second passivation layer and the submount.

In some embodiments, the substrate layer comprises a substrate and an ohmic contact layer formed on the substrate. The first conducting pad, the laser diode, and the second conducting pad are formed on the ohmic contact layer.

In some embodiments, the optoelectronic device further comprises a dielectric layer formed on the substrate layer such that the dielectric layer is further formed between a first side of the laser diode and the first passivation layer, and a second side of the laser diode and the second conducting pad.

In some embodiments, each of the first conducting pad and the second conducting pad comprises an N metal layer formed on the substrate layer, a first seed metal layer formed on the N metal layer, and a first plated layer formed on the first seed metal layer. To form the first conducting pad, the N metal layer is formed on a third side of the dielectric layer, and to form the second conducting pad, the N metal layer is formed on a fourth side of the dielectric layer.

In some embodiments, the first passivation layer is further formed in a region between a first side of the laser diode and the first conducting pad, and a second side of the laser diode and the second conducting pad.

In some embodiments, the optoelectronic device further comprises a second cathode pad formed on the second conducting pad. The second passivation layer further isolates the second cathode pad and the anode pad.

In some embodiments, a first edge of each of (i) the first conducting pad and (ii) the first cathode pad is coated with the second passivation layer, and a second edge of each of (i) the second conducting pad and (ii) the second cathode pad is coated with the second passivation layer.

In some embodiments, the optoelectronic device further comprises metal layers divided into a first metal portion and a second metal portion. The first metal portion is formed on a first region of the first passivation layer, and the second metal portion is formed on the laser diode. The first region of the first passivation layer is formed on the second conducting pad. The anode pad is formed on the first metal portion, and the second passivation layer is formed on the second metal portion.

In some embodiments, the passage of heat occurs by way of a plurality of paths that comprise a first path, a second path, a third path, and a fourth path. The first path is from a top of the laser diode into the second metal portion and to the submount, the second path is from a bottom of the laser diode into the substrate such that the heat is radiated from the substrate, the third path is from the bottom of the laser diode into the substrate and to the submount by way of the first conducting pad and the first cathode pad, and the fourth path is from the bottom of the laser diode into the substrate and to the submount by way of the second conducting pad and the second cathode pad.

In some embodiments, the metal layers comprise a second seed metal layer and a second plated layer. The second seed metal layer is formed on the laser diode and a first region of the first passivation layer. Further, the second plated layer is formed on the second seed metal layer.

In some embodiments, the optoelectronic device further comprises a first solder pad, a first solder trace, a second solder pad, and a second solder trace. The first solder pad and the first solder trace couple the submount with the anode pad. The second solder pad and the second solder trace couple the submount with the first cathode pad. The free space separates the first solder trace and the second solder trace, and further separates the laser diode from the first solder pad and the second solder pad.

In another embodiment, a method for manufacturing an optoelectronic device is provided. The method comprises forming a laser diode on a substrate layer, forming a first conducting pad and a second conducting pad on the substrate layer, and forming a first passivation layer on the second conducting pad and between (i) the first conducting pad and the laser diode and (ii) the second conducting pad and the laser diode. The method further comprises forming a first cathode pad on the first conducting pad, and forming an anode pad above a first region of the first passivation layer. The first region of the first passivation layer is formed on the second conducting pad. The method further comprises forming a second passivation layer above the laser diode. The second passivation layer isolates the first cathode pad and the anode pad. Further, the laser diode, the first conducting pad, the second conducting pad, the first passivation layer, the first cathode pad, the anode pad, and the second passivation layer form a semiconductor die. The method further comprises attaching the semiconductor die to a submount in a flip-chip configuration by way of the anode pad and the first cathode pad to form the optoelectronic device. A free space is created directly between the second passivation layer and the submount.

In some embodiments, the method further comprises forming an ohmic contact layer of the substrate layer. The first conducting pad, the laser diode, and second conducting pad are formed on the ohmic contact layer.

In some embodiments, the method further comprises forming a dielectric layer on the substrate layer such that the dielectric layer separates the laser diode and the first passivation layer.

In some embodiments, the method for forming each of the first conducting pad and the second conducting pad, comprises forming an N metal layer on the substrate layer, forming a first seed metal layer on the N metal layer, and forming a first plated layer on the first seed metal layer. To form the first conducting pad, the N metal layer is formed on a third side of the dielectric layer, and to form the second conducting pad, the N metal layer is formed on a fourth side of the dielectric layer.

In some embodiments, the method further comprises forming the first passivation layer in a region between a first side of the laser diode and the first conducting pad, and a second side of the laser diode and the second conducting pad.

In some embodiments, the method further comprises forming a second cathode pad on the second conducting pad. The second passivation layer isolates the second cathode pad and the anode pad.

In some embodiments, the method further comprises forming metal layers. A first metal portion of the metal layers is formed on a first region of the first passivation layer, and a second metal portion of the metal layers is formed on the laser diode. The first region of the first passivation layer is formed on the second conducting pad. Further, the anode pad is formed on the first metal portion, and the second passivation layer is formed on the second metal portion.

In some embodiments, the method for attaching the semiconductor die to the submount comprises coating a first solder pad and a first solder trace on a first portion of the submount, coating a second solder pad and a second solder trace on a second portion of the submount, and flipping the semiconductor die to couple the anode pad to the first portion of the submount by way of the first solder pad and the first solder trace, and the first cathode pad to the second portion of the submount by way of the second solder pad and the second solder trace. The free space separates the laser diode from the first solder pad and the second solder pad.

Various embodiments of the present disclosure provide a flip-chip optoelectronic device that has contact pads (an anode pad and at least one cathode pad) at a height greater than a laser diode of the optoelectronic device. During flip-chip bonding of a semiconductor die (that includes the anode pad, the cathode pad, and the laser diode) to a submount, the difference in height of the anode and cathode pads with respect to the laser diode results in a free space being created directly between a passivation layer that is coated on top of the laser diode and the submount. The free space reduces the impact of solder stress on the laser core due to the formation of an indirect path between the solder pad (that is used during the bonding of the semiconductor die) and the laser core. In addition, the laser diode and the conducting pads are formed on a substrate layer of the semiconductor die. The anode pad and the cathode pad are formed above a corresponding conducting pad. As the conducting pads are formed directly on the substrate layer, an area of heat dissipation of the semiconductor die of the present disclosure increases as compared to conventional semiconductor dies that have conducting pads formed on a passivation layer of the conventional semiconductor die.

These and other features and advantages of the present disclosure may be appreciated from a review of the following detailed description of the present disclosure, along with the accompanying figures in which like reference numerals refer to like parts throughout.

The present disclosure is best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. In one example, the teachings presented and the needs of a particular application may yield multiple alternate and suitable approaches to implement the functionality of any detail described herein. Therefore, any approach may extend beyond the particular implementation choices in the following embodiments that are described and shown.

References to "an embodiment", "another embodiment", "yet another embodiment", "one example", "another example", "yet another example", "for example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in an embodiment" does not necessarily refer to the same embodiment.

This disclosure relates to contact pads for flip-chip optoelectronic devices. The present disclosure relates to adapting the laser diodes for flip-chip assembly while minimizing the impact of compromised heat-dissipation and solder-bonding stress. Generally, there are two main types of edge-emitting laser diodes, namely Buried Heterostructure (BH) types and ridge-waveguide types. As both of these types of edge-emitting laser diodes possess rather complex sets of relative strengths and weakness on their features, performance, fabrication processes, or the like; lasers from both classes are being deployed in Silicon Photonics according to the merit of the specific application. For the sake of brevity, the present disclosure is described with respect to the ridge waveguide laser; however, the scope of the present disclosure is also applicable to the BH laser.

FIG. 1 is a schematic diagram 100 that illustrates a conventional junction-up mounting of a semiconductor die 102 on a submount 104. The semiconductor die 102 and the submount 104 form a conventional optoelectronic device. The semiconductor die 102 is bonded to the submount 104 by way of a solder pad 106 and a submount trace 108. The semiconductor die 102 includes a base layer 110, a die cathode pad 112, an insulation film 114, a die anode contact 116, and a laser diode 117. The base layer 110 may include a substrate (not shown) and an ohmic contact layer (not shown). The laser diode 117 is formed on a base layer 110 such that the die cathode pad 112 is formed on a backside of the base layer 110. Further, a frontside of the base layer 110 and each side of the laser diode 117 are coated with the insulation film 114. The die anode contact 116 is formed on the insulation film 114 and covers a top portion of the laser diode 117. A laser core 118 of the laser diode 117 is fabricated by epitaxial growth of heterostructure compound semiconductor layers on the base layer 110. The laser core 118 includes an overlapped region for diode junction such as a Multi-Quantum Well Graded-Index Separate-Confinement Heterostructure (MQW-GRIN-SCH) laser structure and a laser core waveguide that is formed by sandwiching the diode junction with upper-cladding and lower cladding waveguides.

Figure 2:
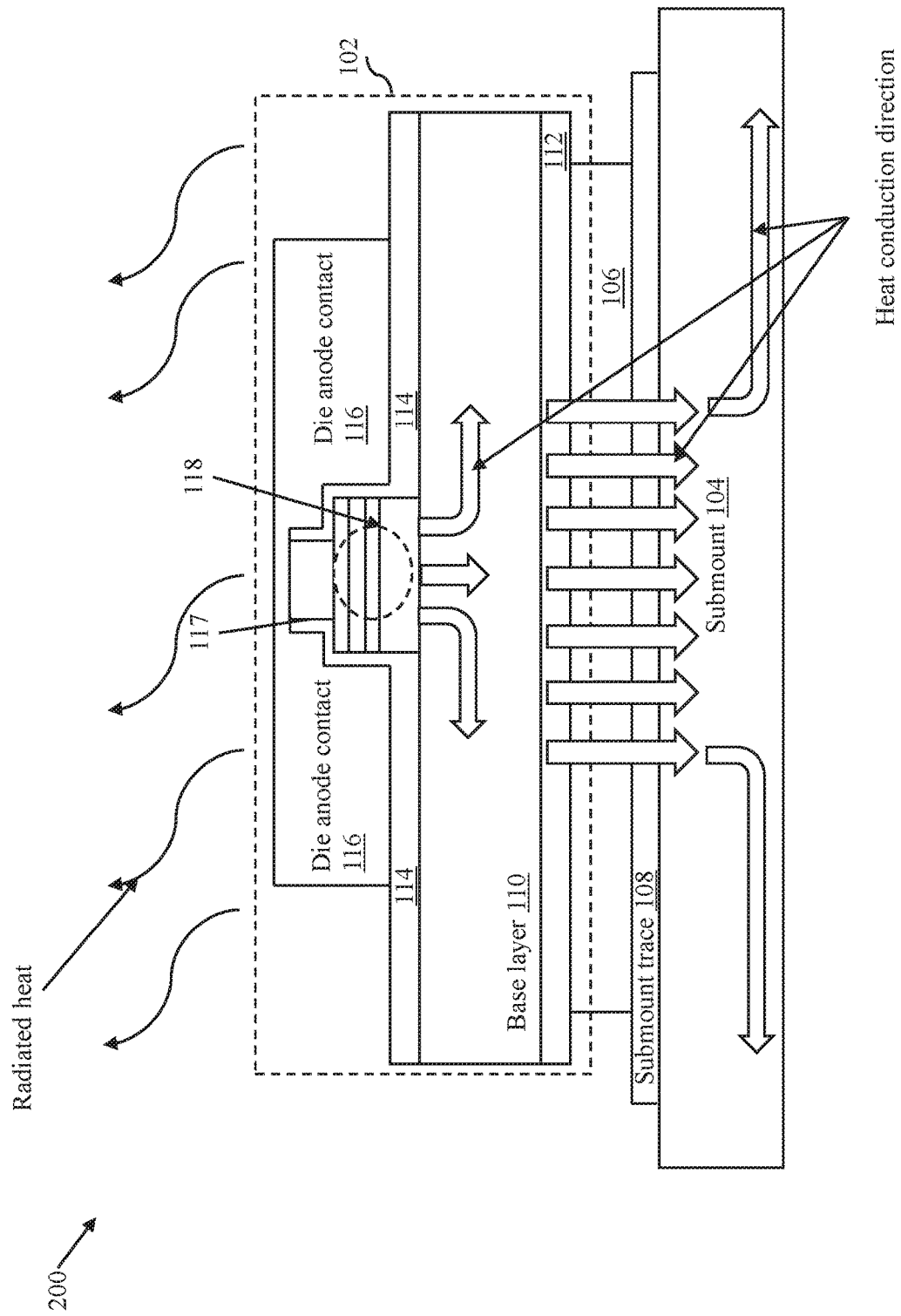
FIG. 2 is a schematic diagram that illustrates heat flow in the conventional junction-up mounting of the semiconductor die on the submount.

FIG. 2 is a schematic diagram 200 that illustrates heat flow in the conventional junction-up mounting of the semiconductor die 102 on the submount 104. The laser core 118 is the source of heat generation in the laser diode 117. The generated heat is dissipated to limit the level of temperature rise in the laser diode 117, as otherwise, the cumulated heat undesirably impacts the laser efficiency of the laser diode 117. Most of the heat is conducted from the laser core 118 via a laser mesa to the backside of the base layer 110 (which also serves as a heat spreader) of the laser diode 117. The heat is further dissipated through the solder pad 106, into the submount 104 for heat spreading and conduction to a heat sink (not shown) that is coupled to the submount 104. The flow of heat is depicted as "heat conduction direction" in FIG. 2.

A very small proportion of the heat generated in the laser core 118 is conducted upwards to the die anode contact 116 of the laser diode 117 to be eventually radiated (depicted as "radiated heat" in FIG. 2). The reason for low heat flow in the upward direction is due to a narrow conduit of a laser ridge of the laser diode 117. A width of the laser ridge of the laser diode 117 is typically at least 10 times narrower than a width of a laser mesa of the laser diode 117. Another reason for the low heat flow is that the insulation film 114 of the laser diode 117 that separates the frontside of the base layer 110 from the die anode contact 116 of the laser diode 117. The insulation film 114 presents a barrier for broadside heat flow from the base layer 110 to the die anode contact 116.

Figure 3:
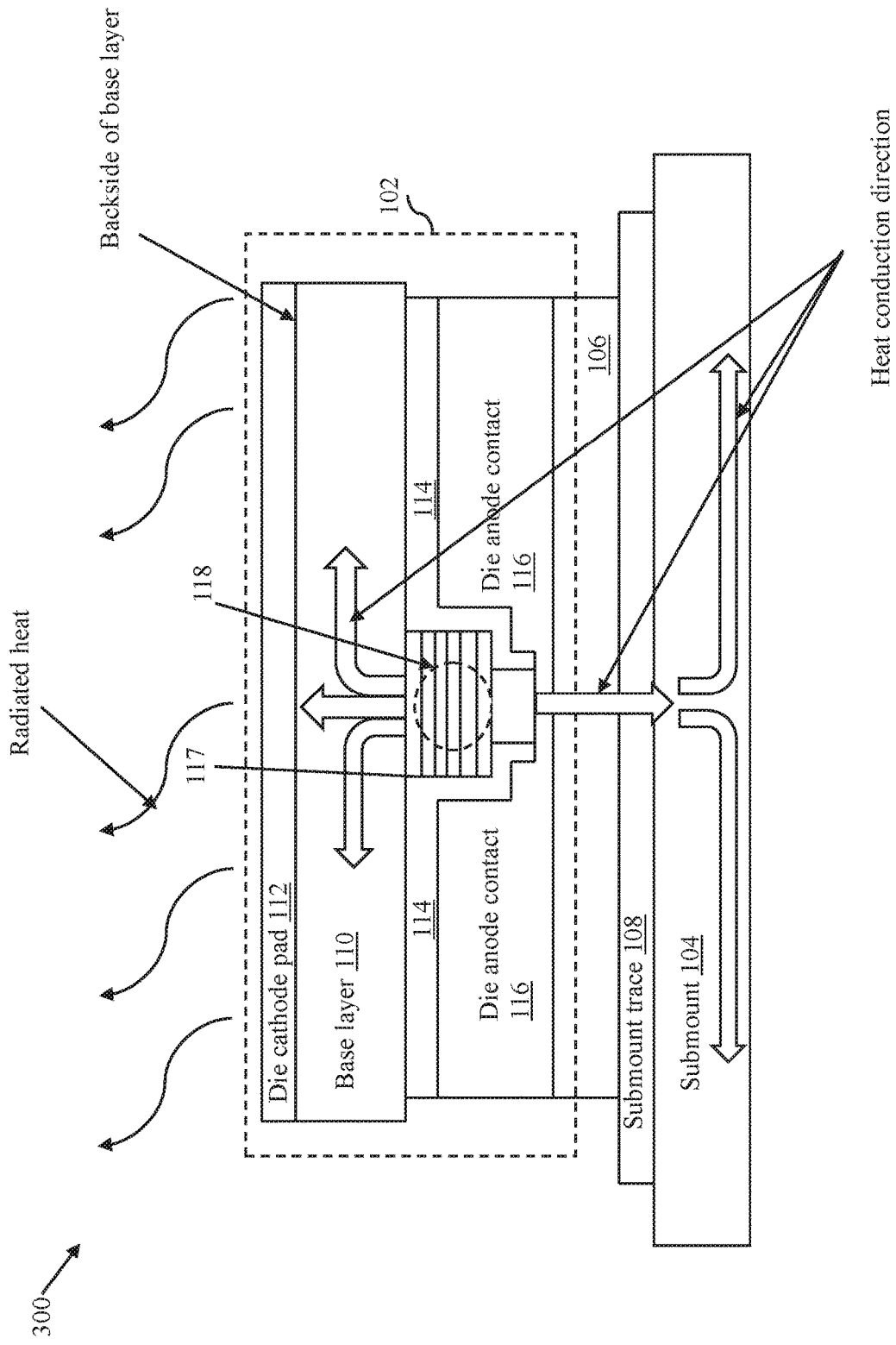
FIG. 3 illustrates another conventional junction-down mounting of the semiconductor die on the submount.

FIG. 3 is a schematic diagram 300 that illustrates another conventional junction-down mounting of the semiconductor die 102 on the submount 104. The submount 104 of FIG. 3 may be a silicon photonics (SiPh) submount. The laser diode 117 is mounted on the submount 104 such that the die anode contact 116 is bonded to the submount 104 in a flip-chip assembly architecture by way of the solder pad 106 and the submount trace 108. A heat dissipation path to the submount 104 is greatly compromised due to poor thermal conductivity path from the laser core 118 of the laser diode 117 through the laser ridge of the laser diode 117. The flow of heat is depicted as "heat conduction direction" in FIG. 3. The radiated heat from the semiconductor die 102 in FIG. 3 is depicted as "radiated heat".

An approach to increase heat dissipation is to mount a separate piece of thermal conductor (not shown) onto the die cathode pad 112 of the laser diode 117 to create a lower thermal resistance path through a laser mesa of the laser diode 117 by way of the backside of the base layer 110. However, such an approach adds more complexity and cost to the flip-chip assembly architecture, which is undesirable.

Figure 4:
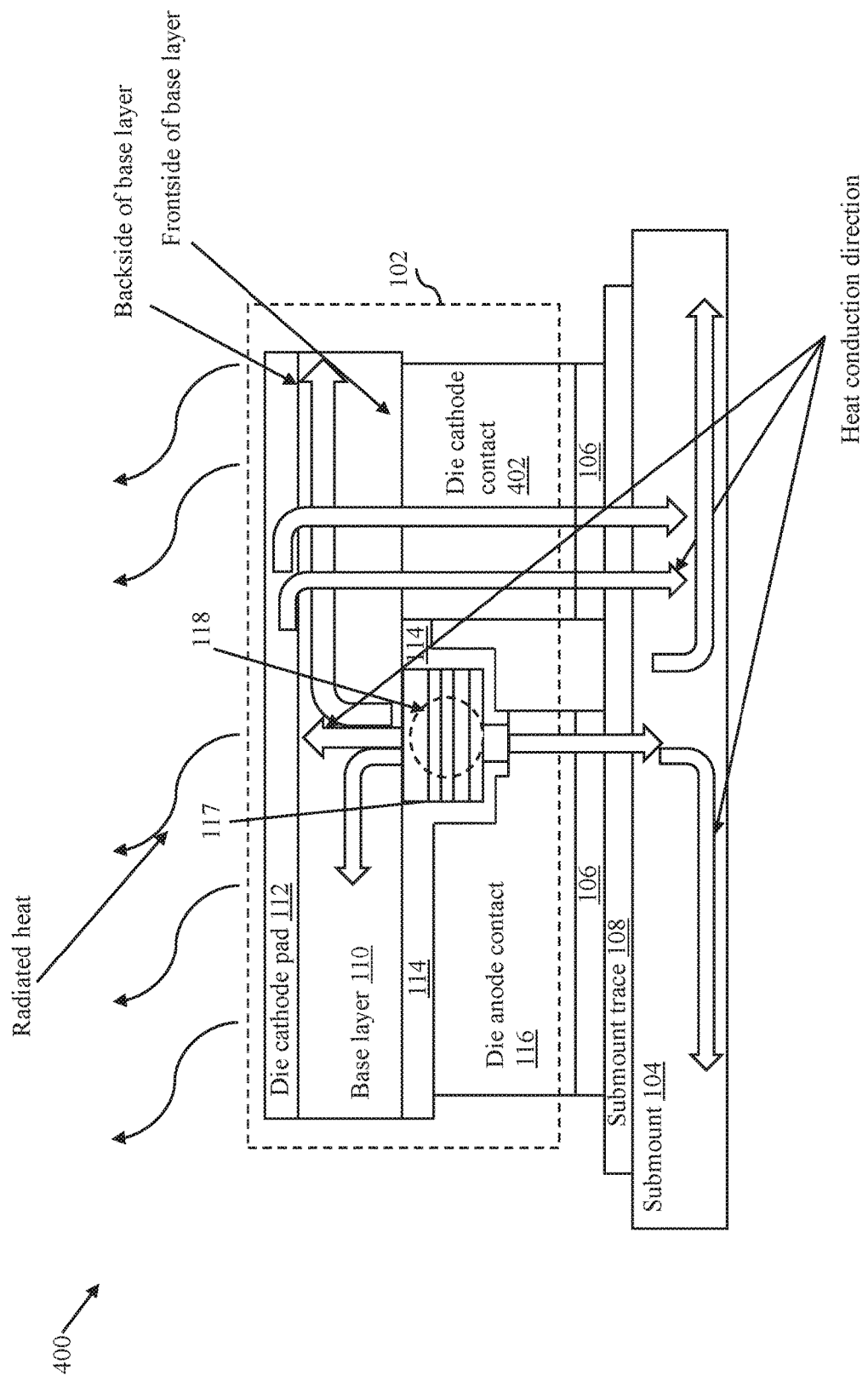
FIG. 4 illustrates yet another conventional junction-down mounting of the semiconductor die on the submount and heat flow in the semiconductor die on the submount of FIG. 4.

FIG. 4 is a schematic diagram 400 that illustrates yet another conventional junction-down mounting of the semiconductor die 102 on the submount 104 and the heat flow in the semiconductor die 102 and the submount 104. The semiconductor die 102 includes the laser diode 117 with co-planar anode and cathode contacts (i.e., the die anode contact 116 and the die cathode contact 402). To form such mounting, a part of the insulation film 114 is removed to allow the die cathode contact 402 to be added to the frontside of the base layer 110 that is, on the same side as the die anode contact 116.

In comparison to the laser diode 117 of FIG. 3 that is junction down mounted, there is an improvement in the heat dissipation in the laser diode 117 of FIG. 4, due to conduction of heat partially on the frontside of the base layer 110. However, there is still a significant reduction in the heat dissipation pathway due to the existence of the insulation film 114 that is needed to electrically insulate the other part of the frontside of the base layer 110 from the die anode contact 116. The flow of heat is depicted as "heat conduction direction" in FIG. 4. The radiated heat from the semiconductor die 102 in FIG. 4 is depicted as "radiated heat".

One solution to increase heat dissipation is to increase the heat flow through the die cathode contact 402 by increasing a width of the die cathode contact 402. However, this leads to an increase in a die width and a die cost of the laser diode 117. Alternatively, a size of the die anode contact 116 can be reduced to free up more space for the die cathode contact 402. However, the size of the die anode contact 116 can only be reduced to a certain level, as there is a certain minimum size needed for effective bonding of the solder pad 106 to the laser diode 117. Typically, the practical minimum contact pad width of each of the die anode contact 116 and die cathode contact 402 may take up to 25% of the actual die width of the laser diode 117. Therefore, there is a trade-off between maximizing the size for the die anode contact 116 for effective bonding and maximizing the size for the die cathode contact 402 for improving the thermal conductivity to the submount 104.

Figures 5A, 5B:
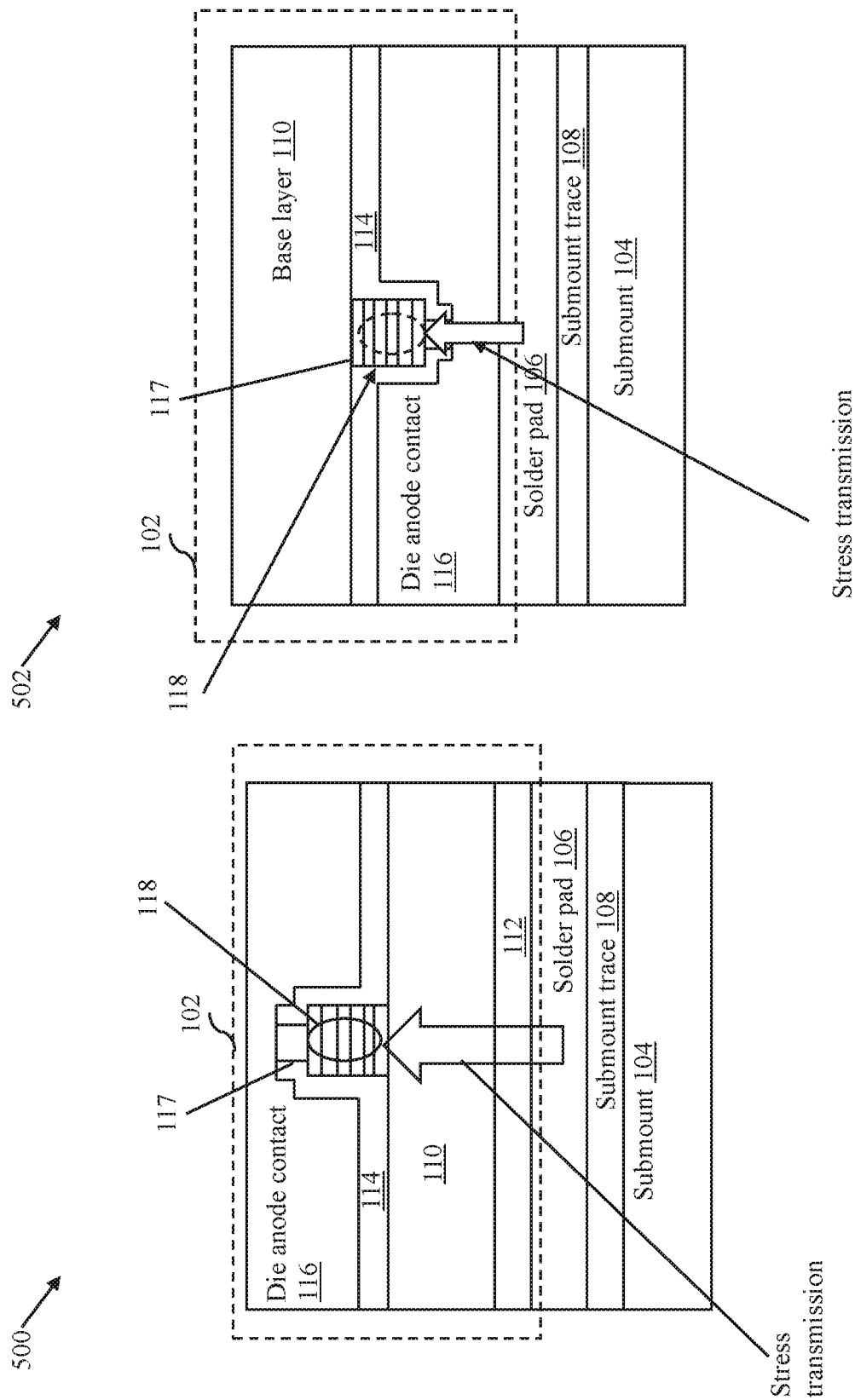
FIG. 5A is a schematic diagram that illustrates a level of bonding-solder stress transmission to a laser core in a laser diode of the semiconductor die that is conventionally junction-up mounted on the submount of FIG. 1.
FIG. 5B is a schematic diagram that illustrates a level of bonding-solder stress transmission to a laser core in a laser diode of the semiconductor die that is conventionally junction-down mounted on the submount of FIG. 3.

FIG. 5A is a schematic diagram 500 that illustrates a level of bonding-solder stress transmission to the laser core 118 in the laser diode 117 of the semiconductor die 102 that is conventionally junction-up mounted on the submount 104. FIG. 5B is a schematic diagram 502 that illustrates a level of bonding-solder stress transmission to the laser core 118 in the laser diode 117 that is conventionally junction-down mounted on the submount 104.

As shown in FIG. 5A, there is a significant amount of separation between the solder pad 106 and the laser core 118 of the laser diode 117, resulting in a low level of stress transmission from the solder pad 106 to the laser core 118 as compared to the stress transmitted from the solder pad 106 to the laser core 118 in FIG. 5B. However, as shown in FIG. 5B, for the case of junction-down assembly of the semiconductor die 102 with the submount 104, the separation between the solder pad 106 and the laser core 118 of the laser diode 117 is much smaller, resulting in a higher level of stress transmission from the solder pad 106 to the laser core 118. Such stress can induce undesirable changes in the performance of the laser diode 117. The changes may impact the performance of the quantum well structure of the laser diode 117 or change the refractive indices of the upper and lower waveguide layers of the laser diode 117.

Figure 6:
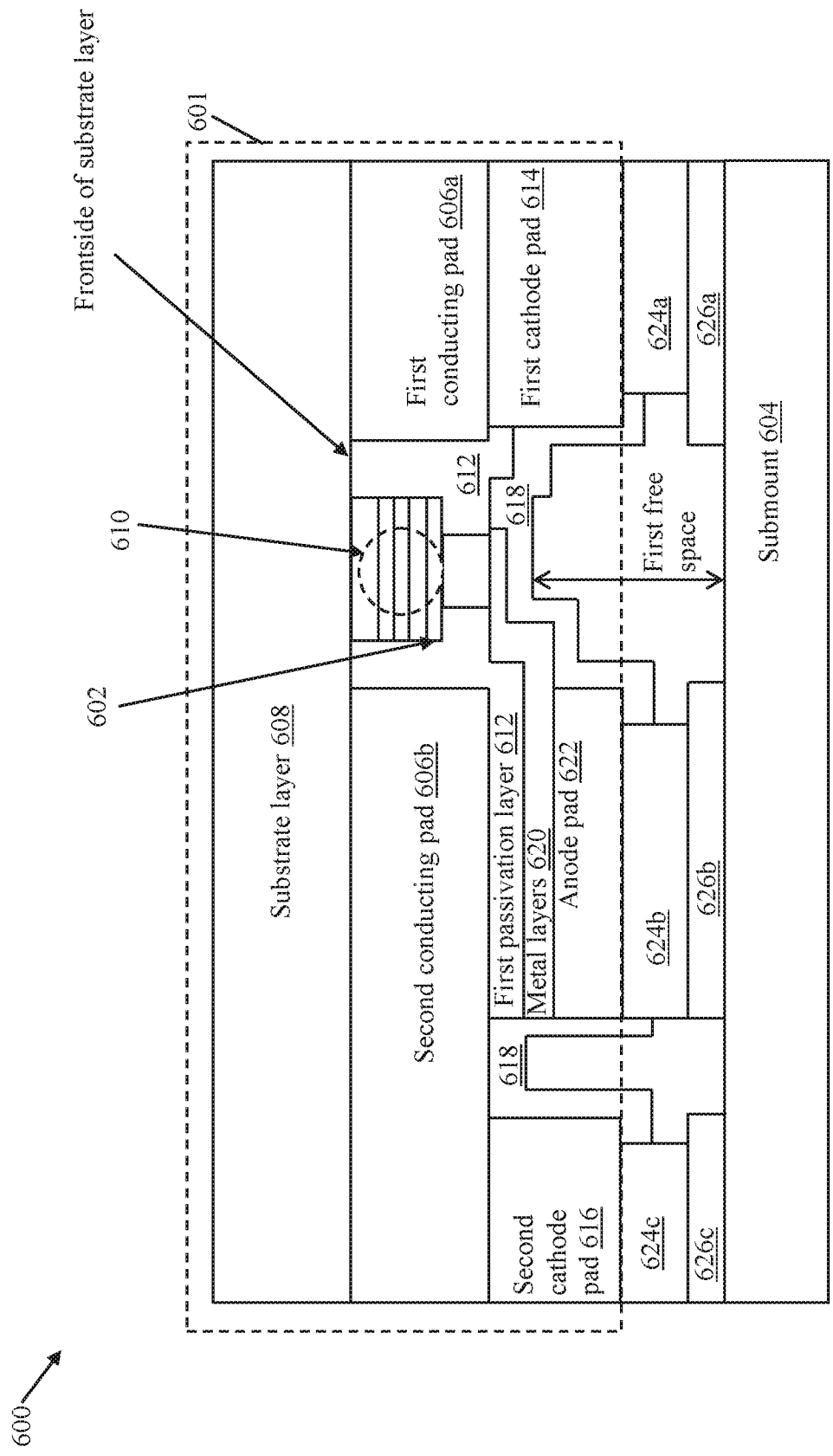
FIG. 6 is a schematic diagram that illustrates an optoelectronic device in accordance with an embodiment of the present disclosure.

FIG. 6 is a schematic diagram that illustrates an optoelectronic device 600 in accordance with an embodiment of the present disclosure. The optoelectronic device 600 includes a semiconductor die 601 and a submount 604. The semiconductor die 601 includes a ridge laser diode 602, a first conducting pad 606a, a second conducting pad 606b, a substrate layer 608, a laser core 610, a first passivation layer 612, a first cathode pad 614, a second cathode pad 616, a second passivation layer 618, metal layers 620, an anode pad 622, a first solder pad 624a, a second solder pad 624b, a third solder pad 624c, a first solder trace 626a, a second solder trace 626b, and a third solder trace 626c. A contact pad scheme of the optoelectronic device 600 for junction-down mounting of the ridge laser diode 602 with the submount 604 ensures low bonding-solder stress and high heat flow conductivity to the submount 604 as described herein. The contact pads of the optoelectronic device 600 include the first cathode pad 614, the second cathode pad 616, and the anode pad 622.

The first conducting pad 606a and the second conducting pad 606b are added during wafer fabrication processing of the ridge laser diode 602. The first conducting pad 606a, the second conducting pad 606b, and the ridge laser diode 602 are formed on the substrate layer 608. The first conducting pad 606a and the second conducting pad 606b may be fabricated using materials with excellent electrical conductivity and thermal conductivity, such as gold that is deposited via electroplating or evaporation on the substrate layer 608. The first conducting pad 606a and the second conducting pad 606b, serve to reclaim the area of thermal interface with a frontside of the substrate layer 608 of the ridge laser diode 602 in comparison with FIGS. 2-5A and 5B. The area of thermal interface on the frontside of the base layer 110 used to be unavailable for heat dissipation in the laser diode 117 illustrated in FIG. 3 and FIG. 5B due to the location of the insulation film 114 (that is coated on the frontside of the base layer 110 barring the portion where the laser diode 117 is grown) and the die anode contact 116.

The first conducting pad 606a and the second conducting pad 606b are located in a vicinity of a laser mesa of the ridge laser diode 602. The first passivation layer 612 isolates the first conducting pad 606a and the second conducting pad 606b from each side of the ridge laser diode 602. Thus, the first passivation layer 612 is formed on a first region of the substrate layer 608 between the ridge laser diode 602 and the first conducting pad 606a, and a second region of the substrate layer 608 between the ridge laser diode 602 and the second conducting pad 606b. Further, the first conducting pad 606a and the second conducting pad 606b have a low thermal resistance path to conduct heat through the substrate layer 608, i.e., the heat is conducted away from the laser core 610 of the ridge laser diode 602.

The first cathode pad 614 is formed on the first conducting pad 606a. Further, the second cathode pad 616 is formed on a first region of the second conducting pad 606b. A second region of the second conducting pad 606b is coated with the first passivation layer 612. A third region of the second conducting pad 606b that is present between the first region and the second region is coated with the second passivation layer 618. The first passivation layer 612 that is formed on the second region of the substrate layer 608 between the ridge laser diode 602 and the second conducting pad 606b is coated with the metal layers 620. The metal layers 620 are further formed on top of the ridge laser diode 602. In addition, the metal layers 620 are formed on the first passivation layer 612 that is coated on the second conducting pad 606b. The anode pad 622 is formed on a first region of the metal layers 620. The first region of the metal layers 620 is formed on the first passivation layer 612.

The first solder pad 624a is formed on the first cathode pad 614. The second solder pad 624b is formed on the anode pad 622, and the third solder pad 624c is formed on the second cathode pad 616. Further, the first solder trace 626a, the second solder trace 626b, and the third solder trace 626c contact each of the first solder pad 624a, the second solder pad 624b, and the third solder pad 624c to the submount 604, respectively. The first solder pad 624a, the second solder pad 624b, and the third solder pad 624c bond a first region of the submount 604, a second region of the submount 604, and a third region of the submount 604 to the first solder pad 624a, the second solder pad 624b, and the third solder pad 624c, respectively. The first solder pad 624a, the second solder pad 624b, the third solder pad 624c, the first solder trace 626a, the second solder trace 626b, and the third solder trace 626c are formed by the process of soldering. A fourth region of the submount 604 and a fifth region of the submount 604 is left uncoated. The fourth region of the submount 604 is present between the first region of the submount 604 and the second region of the submount 604 whereas the fifth region of the submount 604 is present between the second region of the submount 604 and the third region of the submount 604.

The second passivation layer 618 is further coated on a first side of the first cathode pad 614, a first edge of the first cathode pad 614, a second side of the anode pad 622, and a first edge of the anode pad 622. The first side of the first cathode pad 614 and the second side of the anode pad 622 face towards the ridge laser diode 602. A first free space is created between the second passivation layer 618 that is formed on top of the ridge laser diode 602 and the fourth region of the submount 604. The first free space is created due to a difference in a height of the ridge laser diode 602, and a height of the anode pad 622 and a height of the first cathode pad 614. The height of the ridge laser diode 602 is lower than the height of each of the anode pad 622 and the height of the first cathode pad 614. The first free space is an empty space, a void region, or a gap. The first free space thus separates the first solder pad 624a from the ridge laser diode 602. The first free space further separates the second solder pad 624b from the ridge laser diode 602. Further, a second free space is similarly created between the second passivation layer 618 that is formed on the third region of the second conducting pad 606b and the fifth region of the submount 604. The second free space is an empty space, a void region, or a gap that is created due to a difference in a height of the second conducting pad 606b and a height of the second cathode pad 616.

Figure 7:
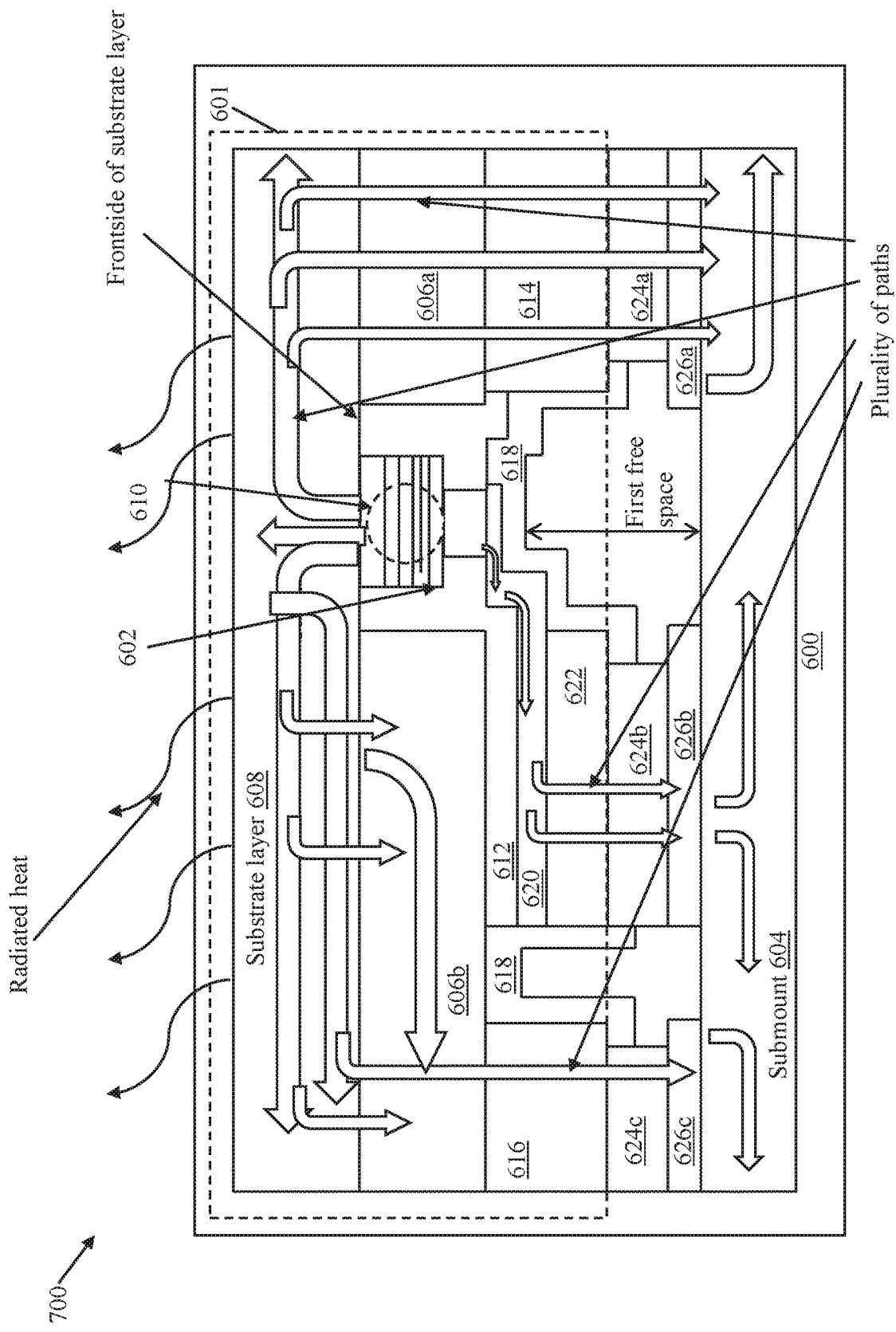
FIG. 7 is a schematic diagram that illustrates heat flow in the optoelectronic device of FIG. 6, in accordance with an embodiment of the present disclosure.

FIG. 7 is a schematic diagram 700 that illustrates heat flow in the optoelectronic device 600 in accordance with an embodiment of the present disclosure. Heat is routed from the laser mesa of the ridge laser diode 602 through the front-side of the substrate layer 608, through the first conducting pad 606a and the second conducting pad 606b and the respective contact-pads (i.e., the first cathode pad 614, the anode pad 622, and the second cathode pad 616) of the ridge laser diode 602 into the submount 604. Thus, the passage of heat occurs by way of a plurality of paths that comprise a first path, a second path, a third path, and a fourth path. The first path is from a top of the ridge laser diode 602 into a first metal portion of the metal layers 620, the anode pad 622 and to the submount 604. The second path is from a bottom of the ridge laser diode 602 into the substrate layer 608 such that the heat is radiated from the substrate layer 608. The third path is from the bottom of the ridge laser diode 602 into the substrate layer 608 and to the submount 604 by way of the first conducting pad 606a and the first cathode pad 614. Further, the fourth path is from the bottom of the ridge laser diode 602 into the substrate layer 608 and to the submount 604 by way of the second conducting pad 606b and the second cathode pad 616. It will be understood by a person skilled in the art that although four paths of heat dissipation are stated herein for illustrative purposes, the heat dissipation is not limited to the four paths. Heat may be dissipated through various other paths in the optoelectronic device 600 that lies within the scope of the present disclosure.

With the present disclosure, almost the entire area of the frontside of the substrate layer 608, amounting to greater than 90% of the die area (the area occupied by the laser mesa of the ridge laser diode 602 which typically accounts for less than 10% of the total die area) of the substrate layer 608 is available for heat conduction. This is a significant increase with respect to FIG. 3 where the frontside of the base layer 110 under the die anode contact 116, accounts from 25% to 50% of a die area of the semiconductor die 102, which is unavailable for effective heat conduction.

Figure 8:
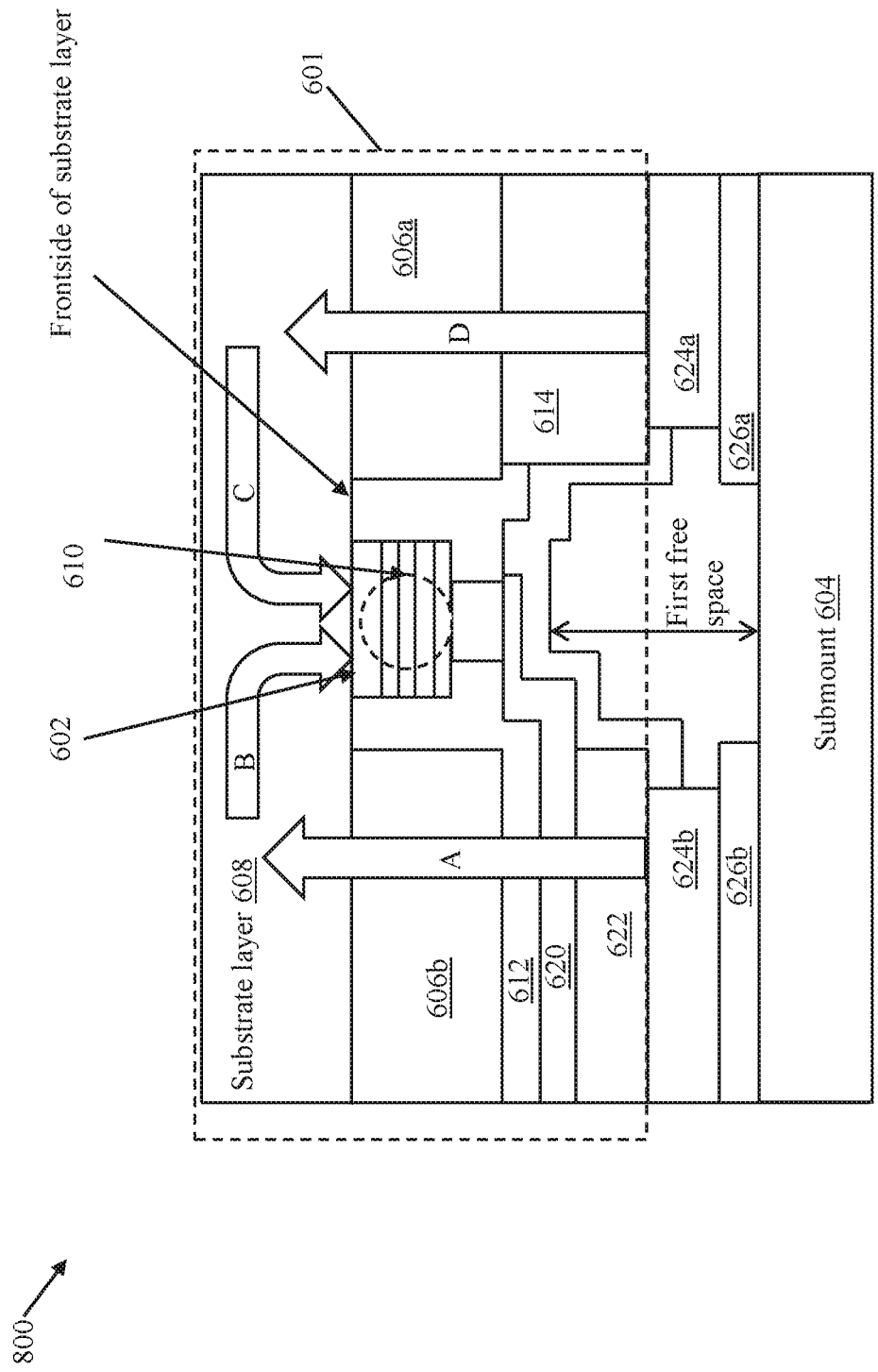
FIG. 8 is a schematic diagram that illustrates a level of bonding-solder stress transmission to a laser core of a ridge laser diode of the optoelectronic device of FIG. 6, in accordance with an exemplary embodiment of the present disclosure.

FIG. 8 is a schematic diagram 800 that illustrates a low level of bonding-solder stress transmission to the laser core 610 of the ridge laser diode 602 in accordance with an embodiment of the present disclosure. The laser core 610 in the ridge laser diode 602 is not directly connected to the bonding solder (i.e., the first solder pad 624a and the second solder pad 624b) through a solid media, but instead the direct pathway to the submount 604 is provided by the first free space, which is non-strain transmissive. The alternative path A-B and D-C for stress transmission is circuitous or non-unidirectional, and lengthy, and hence not effective in stress transmission to the laser core 610.

Figure 9:
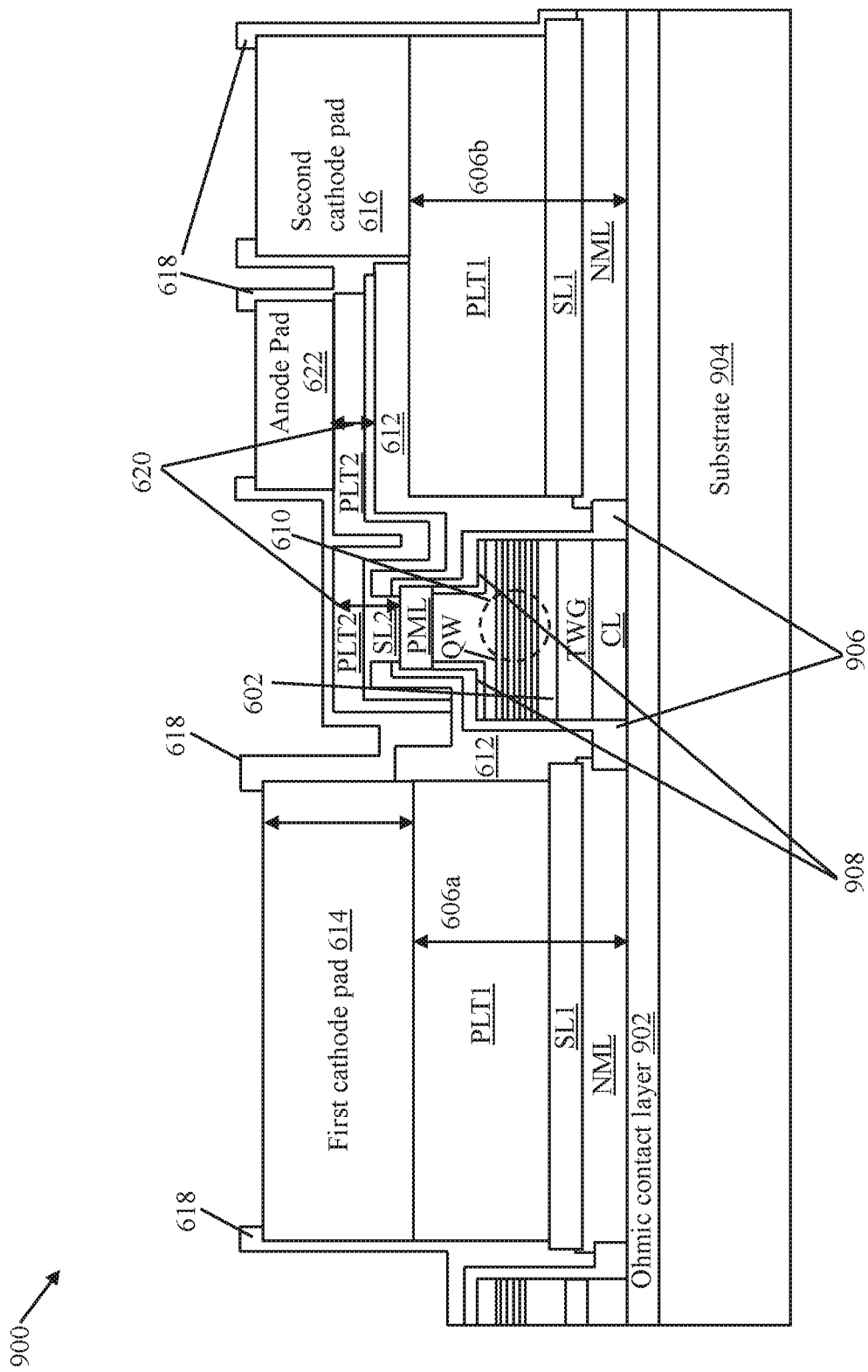
FIG. 9 is a schematic diagram that illustrates a sectional view of a layer structure of a semiconductor die of the optoelectronic device of FIG. 6, in accordance with an exemplary embodiment of the present disclosure.

FIG. 9 is a schematic diagram that illustrates a sectional view of a layer structure 900 of the semiconductor die 601 of the optoelectronic device 600, in accordance with an exemplary embodiment of the present disclosure. An ohmic contact layer 902 is deposited on a substrate 904. The ohmic contact layer 902 and the substrate 904 form the substrate layer 608. The ohmic contact layer 902 is an N-type ohmic contact layer. The material for forming the substrate 904 may include, but is not limited to, Gallium Arsenide (GaAs), Indium Phosphide (InP), or a combination thereof.

The ridge laser diode 602 is formed on the ohmic contact layer 902 epitaxially using wafer fabrication processes to fabricate quantum wells QW, a transition waveguide TWG, and cladding and contact layers CL of the ridge laser diode 602 as will be understood by a person skilled in the art. The laser core 610 of the ridge laser diode 602 is etched to form a ridge waveguide. A dielectric layer 906 is coated on each side of the ridge laser diode 602. Further, the dielectric layer 906 is coated on a first region of the ohmic contact layer 902 and a second region of the ohmic contact layer 902. The first region of the ohmic contact layer 902 and the second region of the ohmic contact layer 902 are adjacent to a first side of the ridge laser diode 602 and a second side of the ridge laser diode 602, respectively. The dielectric layer 906 is etched on a top of the ridge laser diode 602 to form an opening for an anode of the ridge laser diode 602. Examples of the dielectric layer 906 may include, but are not limited to silicon dioxide ($SiO_2$), silicon nitride (SiN), and silicon oxynitride (SiON).

A P-metal layer PML is evaporated to form the anode of the ridge laser diode 602. Further, the ridge laser diode 602 is etched to form the laser mesa. A second dielectric layer 908 is deposited on each side of the ridge waveguide of the ridge laser diode 602. Further, the second dielectric layer 908 is etched to form openings for diode contacts. An N metal layer NML is formed by evaporation on the ohmic contact layer 902 to form a base layer of a first conducting pad 606a and a second conducting pad 606b. The N metal layer NML is formed towards each side of the ridge laser diode 602 on the substrate layer 608. To form the first conducting pad 606a, the N metal layer NML is formed on a third side of the dielectric layer 906, and to form the second conducting pad 606b, the N metal layer NML is formed on a fourth side of the dielectric layer 906. The third side of the dielectric layer 906 and the fourth side of the dielectric layer 906 are in direct contact with the ridge laser diode 602. Thus, the first conducting pad 606a and the second conducting pad 606b are formed on the ohmic contact layer 902.

The first seed metal layer SL1 is formed by masked evaporation on the N metal layer NML on each side of the ridge laser diode 602. Each of the N metal layer NML and the first seed metal layer SL1 is formed by depositing the N metal layer NML and the first seed metal layer SL1 on a corresponding layer using a thin film deposition technique such as chemical vapor deposition (CVD), physical vapor deposition (PVD), atomic layer deposition (ALD) or another suitable deposition technique and patterning each of the N metal layer NML and the first seed metal layer SL1 by an etching process such as wet etching, plasma etching that includes but is not limited to reactive ion etching and deep reactive ion etching, sputter etching, or a combination thereof. The N metal layer NML acts as a transition layer between the ohmic contact layer 902 and the first conducting pad 606a, and the ohmic contact layer 902 and the second conducting pad 606b. The first seed metal layer SL1 acts as a facilitation layer for the plating process to form a first plated layer PLT1.

The first plated layer PLT1 is formed by masked electroplating on the first seed metal layer SL1. The N metal layer NML, the first seed metal layer SL1, and the first plated layer PLT1 formed towards the first side of the ridge laser diode 602 forms the first conducting pad 606a, whereas the N metal layer NML, the first seed metal layer SL1, and the first plated layer PLT1 formed towards the second side of the ridge laser diode 602 forms the second conducting pad 606b. The first plated layer PLT1 acts as a height adjustment layer for the first conducting pad 606a and the second conducting pad 606b. In an embodiment, a height of the first conducting pad 606a matches the height of the second conducting pad 606b. Further, the height of the first cathode pad 614 matches each of the height of the anode pad 622 and the height of the second cathode pad 616.

The first passivation layer 612 is formed on the second conducting pad 606b. The first passivation layer 612 is further formed between the first conducting pad 606a and the ridge laser diode 602 and (ii) the second conducting pad 606b and the ridge laser diode 602. Alternatively stated, the first passivation layer 612 is further formed in a region between the first side of the ridge laser diode 602 and the first conducting pad 606a, and the second side of the ridge laser diode 602 and the second conducting pad 606b. The first passivation layer 612 may be an insulating film such as $SiO_2$, SiN, and SiON that may be grown using a thin film deposition technique such as CVD, PVD, ALD, or a suitable combination thereof.

The metal layers 620 are formed on top of the ridge laser diode 602 and the first passivation layer 612 by masked electroplating. The metal layers 620 are divided into a first metal portion and a second metal portion. The first metal portion is formed on a first region of the first passivation layer 612. The second metal portion is formed on the ridge laser diode 602. The first region of the first passivation layer 612 is formed on the second conducting pad 606b. The metal layers 620 include a second seed metal layer SL2 and a second plated layer PLT2. The second seed metal layer SL2 is formed on the ridge laser diode 602 (i.e., on top of the P-metal layer PML) and a first region of the first passivation layer 612 by masked evaporation. The first region of the first passivation layer 612 is formed on each side of a ridge of the ridge laser diode 602 and on top of the second conducting pad 606b. The second plated layer PLT2 is formed on the second seed metal layer SL2 by masked electroplating. The second plated layer PLT2 is optionally added to conduct a certain amount of heat from the top of the ridge laser diode 602.

The anode pad 622 is formed on the first metal portion. Further, the second passivation layer 618 is formed on the second metal portion by masked electroplating. The first cathode pad 614 is formed on the first conducting pad 606a. The second passivation layer 618 is further formed above the ridge laser diode 602, and isolates the first cathode pad 614 and the anode pad 622. Further, the second cathode pad 616 is formed on the second conducting pad 606b. In operation, light is emitted from the laser core 610 on application of a potential difference across the first cathode pad 614 and the anode pad 622 due to electron hole recombination occurring in the ridge laser diode 602. The light may be further emitted from the laser core 610 on application of a potential difference across the second cathode pad 616 and the anode pad 622 as will be understood by a person skilled in the art. Each of the metal layers 620, the first conducting pad 606a, the second conducting pad 606b, the first plated layer PLT1, the second plated layer PLT2, the anode pad 622, the first cathode pad 614, and the second cathode pad 616 may be formed from metals such as gold, chromium, aluminum, silver, platinum, nickel, copper, rhodium, palladium, tungsten, and combinations of such materials. Other configurations of metals may employ combinations of metals, for example, a chromium adhesion layer and a gold electrode layer.

The second passivation layer 618 further isolates the second cathode pad 616 and the anode pad 622. The second passivation layer 618 may be an insulating film such as SiO$_2$, SiN, and SiON that may be grown using a thin film deposition technique such as CVD, PVD, ALD, or a suitable combination thereof. A first edge of each of the first conducting pad 606a and the first portion of the first cathode pad 614 is coated with the second passivation layer 618. Further, a second edge of the first cathode pad 614 is coated with the second passivation layer 618. Furthermore, a second edge of each of the second conducting pad 606b and the second cathode pad 616 is coated with the second passivation layer 618. The second passivation layer 618 is further coated on each side of the anode pad 622.

Figure 10A:
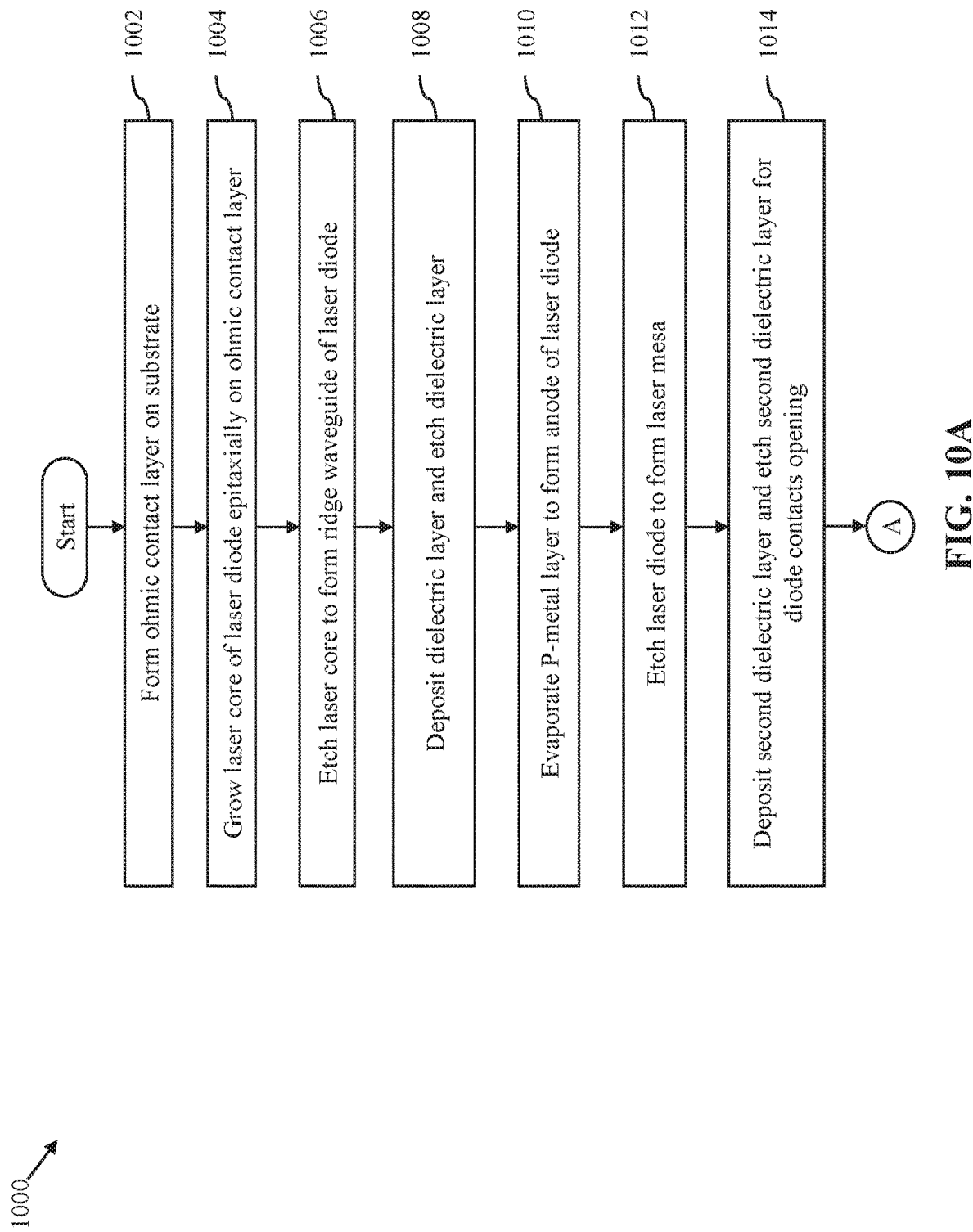
FIGS. 10A, 10B, and 10C, collectively represent a flowchart that illustrates a wafer fabrication process flow for the optoelectronic device of FIG. 6, in accordance with an exemplary embodiment of the present disclosure.
Figure 10B:
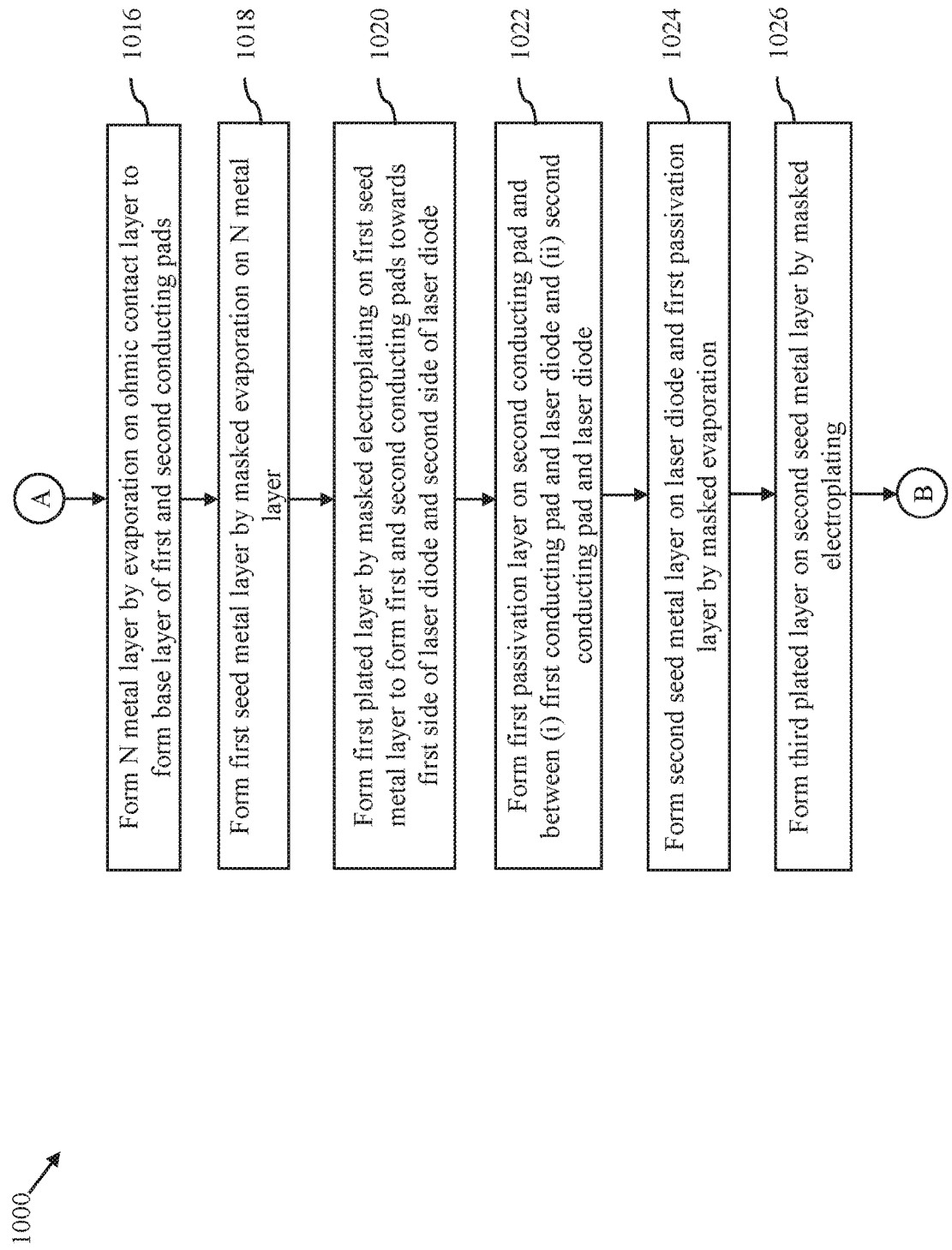
Figure 10C:
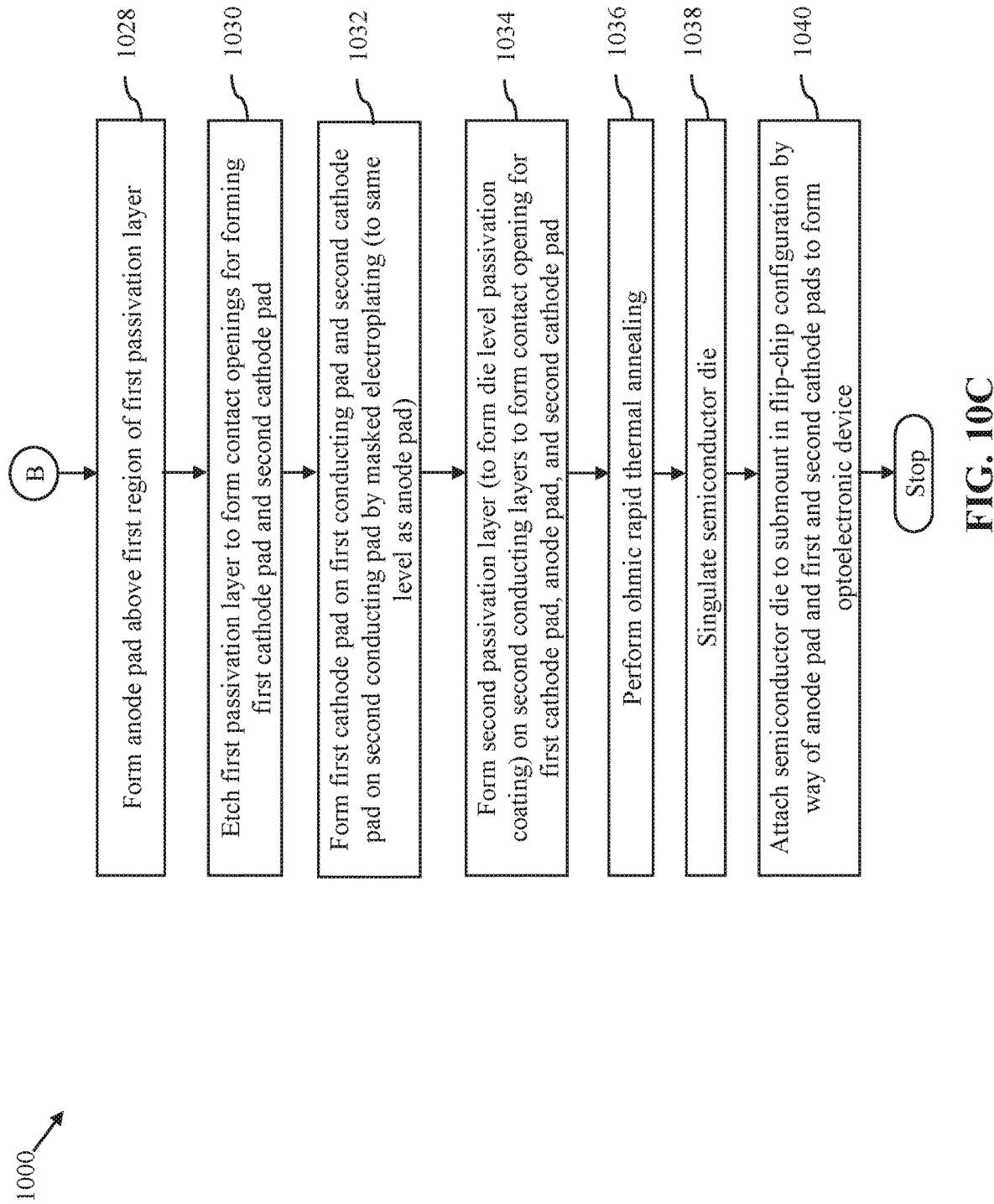

FIGS. 10A, 10B, and 10C, collectively represent a flowchart 1000 that illustrates a wafer fabrication process flow for the optoelectronic device 600 (i.e., a method for manufacturing the optoelectronic device 600), in accordance with an exemplary embodiment of the present disclosure.

At 1002, the ohmic contact layer 902 is formed on the substrate 904. At 1004, the laser core 610 of the ridge laser diode 602 is epitaxially grown on the ohmic contact layer 902. At 1006, the laser core 610 is etched to form a ridge waveguide of the ridge laser diode 602. At 1008, the dielectric layer 906 is deposited on the ohmic contact layer 902 and the ridge laser diode 602 and etched to form the dielectric layer 906 on each side of the ridge laser diode 602. At 1010, the P-metal layer PML is evaporated to form the anode of the ridge laser diode 602. At 1012, the ridge laser diode 602 is etched to form the laser mesa. At 1014, the second dielectric layer 908 is deposited on each side of the ridge waveguide of the ridge laser diode 602. Further, the second dielectric layer 908 is etched to form openings for diode contacts.

At 1016, the N metal layer NML is formed by evaporation on the ohmic contact layer 902 to form the base layer of the first conducting pad 606a and the second conducting pad 606b. At 1018, the first seed metal layer SL1 is formed by masked evaporation on the N metal layer NML. At 1020, the first plated layer PLT1 is formed by masked electroplating on the first seed metal layer SL1 to form the first conducting pad 606a and the second conducting pad 606b towards the first side of the ridge laser diode 602 and the second side of the ridge laser diode 602. At 1022, the first passivation layer 612 is formed on the second conducting pad 606b and between the first conducting pad 606a and the ridge laser diode 602, and the second conducting pad 606b and the ridge laser diode 602. At 1024, the second seed metal layer SL2 is formed on the ridge laser diode 602 and the first passivation layer 612 that is formed on the ridges of the ridge laser diode 602, in the region between the second side of the ridge laser diode 602 and the second conducting pad 606b, and top of the first plated layer PLT1 by masked evaporation. At 1026, the second plated layer PLT2 is formed on the second seed metal layer SL2 by masked electroplating.

At 1028, the anode pad 622 is formed above a first region of the first passivation layer 612. In addition, the anode pad 622 is formed on a portion of the second plated layer PLT2 that is formed on the first region of the first passivation layer 612. The first region of the first passivation layer 612 is formed on the second conducting pad 606b. At 1030, the first passivation layer 612 is etched to form contact openings for forming the first cathode pad 614 and the second cathode pad 616. At 1032, the first cathode pad 614 is formed on the first conducting pad 606a, and the second cathode pad 616 is formed on the second conducting pad 606b by masked electroplating to the same level as the anode pad 622. At 1034, the second passivation layer 618 is formed (to form die level passivation coating) on the second conducting pad 606b to further form the contact openings for the first cathode pad 614, the anode pad 622, and the second cathode pad 616. At 1036, ohmic rapid thermal annealing is performed. At 1038, the semiconductor die 601 with the layer structure 900 is singulated. At 1040, the semiconductor die 601 is attached to the submount 604 in the flip-chip configuration by way of the anode pad 622, the first cathode pad 614, the second cathode pad 616, the first solder pad 624a, the second solder pad 624b, the third solder pad 624c, the first solder trace 626a, the second solder trace 626b, and the third solder trace 626c to form the optoelectronic device 600.

Figure 11:
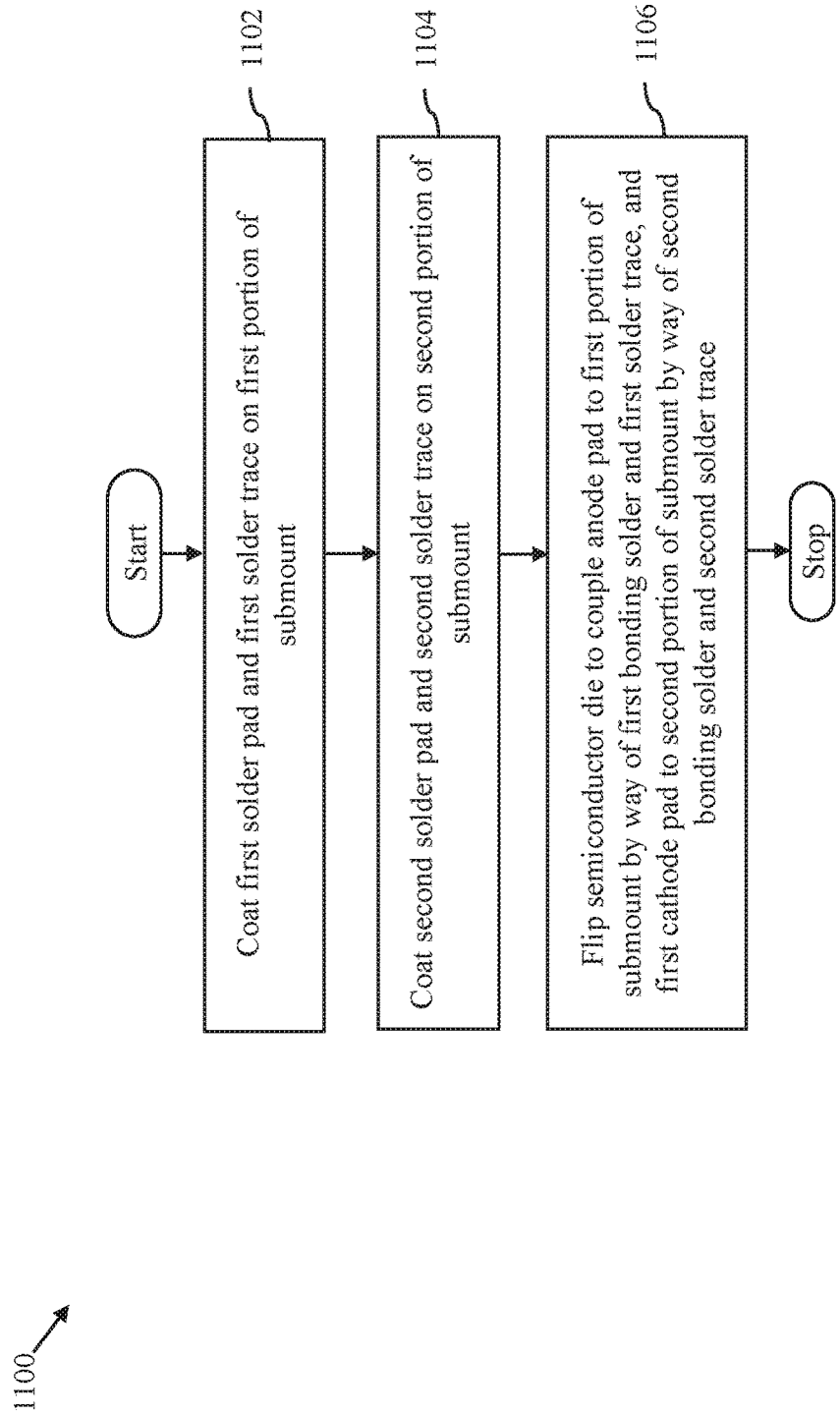
FIG. 11 represents a flowchart for attaching the semiconductor die to a submount to form the optoelectronic device of FIG. 6, in accordance with an exemplary embodiment of the present disclosure.

FIG. 11 represents a flowchart 1100 for attaching the semiconductor die 601 to the submount 604 to form the optoelectronic device 600 of FIG. 6, in accordance with an exemplary embodiment of the present disclosure. At 1102, the first solder pad 624a and the first solder trace 626a are coated on the first portion of the submount 604. At 1104, the second solder pad 624b and the second solder trace 626b are coated on the second portion of the submount 604. In another embodiment, the first solder pad 624a and the second solder pad 624b are directly coated on the first cathode pad 614 and the anode pad 622, respectively. At 1106, the semiconductor die 601 is flipped to couple the anode pad 622 to the first portion of the submount 604 by way of the first solder pad 624a and the first solder trace 626a, and the first cathode pad 614 to the second portion of the submount 604 by way of the second solder pad 624b and the second solder trace 626b.

The optoelectronic device 600 thus enables low stress transmission to the ridge laser diode 602 due to the indirect path of stress exertion as compared to conventional optoelectronic devices that have a direct path between the solder pad 106 and the laser diode 117. Due to the absence of insulation film 114 between the first conducting pad 606a and the substrate layer 608, and the second conducting pad 606b and the substrate layer 608 the area for heat dissipation increases as compared to conventional optoelectronic devices that included the insulation film 114 between the die anode contact 116 and the base layer 110. The increase in the area for heat dissipation avoids usage of thermal conductors in the optoelectronic device 600 to dissipate heat that were employed by conventional optoelectronic devices thereby decreasing the complexity of designing the optoelectronic device 600 and the cost of manufacturing the optoelectronic device 600 as compared to the design and cost of manufacturing conventional optoelectronic devices. Further, a width of the first cathode pad 614 need not be increased beyond the desired width whereas the anode pad 622 need not be reduced beyond the desired width for additional heat dissipation. Thus, the cost of manufacturing the semiconductor die 601 is less as compared to the semiconductor die 102.

The applicability of the present disclosure is not limited to the ridge laser diode 602 as described in FIGS. 6-9 and 10A-10C, and is extendable to include BH categories of edge-emitting optoelectronics device constructions, and for various other types of edge-emitting optoelectronics devices including lasers, semiconductor optical amplifiers, modulators, photodetectors, optical switches, or the like.

Techniques consistent with the disclosure provide, among other features, contact pads for flip-chip optoelectronic devices. While various exemplary embodiments of the disclosed system and method have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope.

The invention claimed is:

1. An optoelectronic device, comprising:
a semiconductor die comprising:
   a substrate layer;
   a laser diode formed on the substrate layer;
   a first conducting pad and a second conducting pad, wherein the first conducting and the second conducting pad are formed on the substrate layer;
   a first passivation layer formed on the second conducting pad, and between (i) the first conducting pad and the laser diode and (ii) the second conducting pad and the laser diode;
   a first cathode pad formed on the first conducting pad;
   an anode pad formed above a first region of the first passivation layer, wherein the first region of the first passivation layer is formed on the second conducting pad; and
   a second passivation layer formed above the laser diode, and isolates the first cathode pad and the anode pad; and
a submount, wherein the semiconductor die is coupled to the submount in a flip-chip configuration by way of the anode pad and the first cathode pad such that a free space is created directly between the second passivation layer and the submount.

2. The optoelectronic device of claim 1, wherein the substrate layer comprises:
   a substrate; and
   an ohmic contact layer formed on the substrate, wherein the first conducting pad, the laser diode, and the second conducting pad are formed on the ohmic contact layer.

3. The optoelectronic device of claim 1, further comprising a dielectric layer formed on the substrate layer such that the dielectric layer is further formed between a first side of the laser diode and the first passivation layer, and a second side of the laser diode and the second conducting pad.

4. The optoelectronic device of claim 3, wherein each of the first conducting pad and the second conducting pad comprises:
   an N metal layer formed on the substrate layer;
   a first seed metal layer formed on the N metal layer; and
   a first plated layer formed on the first seed metal layer, wherein (i) to form the first conducting pad, the N metal layer is formed on a third side of the dielectric layer, and (ii) to form the second conducting pad, the N metal layer is formed on a fourth side of the dielectric layer.

5. The optoelectronic device of claim 1, wherein the first passivation layer is further formed in a region between a first side of the laser diode and the first conducting pad, and a second side of the laser diode and the second conducting pad.

6. The optoelectronic device of claim 1, further comprising a second cathode pad formed on the second conducting pad, wherein the second passivation layer further isolates the second cathode pad and the anode pad.

7. The optoelectronic device of claim 6, wherein:
   (i) a first edge of each of (i) the first conducting pad and (ii) the first cathode pad is coated with the second passivation layer, and
   (ii) a second edge of each of (i) the second conducting pad and (ii) the second cathode pad is coated with the second passivation layer.

8. The optoelectronic device of claim 6, further comprising metal layers divided into a first metal portion and a second metal portion, wherein the first metal portion is formed on the first region of the first passivation layer, and the second metal portion is formed on the laser diode, wherein the first region of the first passivation layer is formed on the second conducting pad, and wherein the anode pad is formed on the first metal portion, and the second passivation layer is formed on the second metal portion.

9. The optoelectronic device of claim 8, wherein passage of heat occurs by way of a plurality of paths that comprise a first path, a second path, a third path, and a fourth path, wherein the first path is from a top of the laser diode into the second metal portion and to the submount, the second path is from a bottom of the laser diode into the substrate layer such that the heat is radiated from the substrate layer, the third path is from the bottom of the laser diode into the substrate layer and to the submount by way of the first conducting pad and the first cathode pad, and the fourth path is from the bottom of the laser diode into the substrate layer and to the submount by way of the second conducting pad and the second cathode pad.

10. The optoelectronic device of claim 8, wherein the metal layers comprise:
    a second seed metal layer formed on the laser diode and the first region of the first passivation layer; and
    a second plated layer formed on the second seed metal layer.

11. The optoelectronic device of claim 1, further comprising:
    a first solder pad and a first solder trace that couple the submount with the anode pad; and
    a second solder pad and a second solder trace that couple the submount with the first cathode pad, wherein the free space separates the first solder trace and the second solder trace, and wherein the free space further separates the laser diode from the first solder pad and the second solder pad.

12. A method for manufacturing an optoelectronic device, the method comprising:
    forming a laser diode on a substrate layer;
    forming a first conducting pad and a second conducting pad on the substrate layer;
    forming a first passivation layer on the second conducting pad, and between (i) the first conducting pad and the laser diode and (ii) the second conducting pad and the laser diode;
    forming a first cathode pad on the first conducting pad;
    forming an anode pad above a first region of the first passivation layer, wherein the first region of the first passivation layer is formed on the second conducting pad,
    forming a second passivation layer above the laser diode, wherein the second passivation layer isolates the first cathode pad and the anode pad, and wherein the laser diode, the first conducting pad, the second conducting pad, the first passivation layer, the first cathode pad, the anode pad, and the second passivation layer form a semiconductor die; and
    attaching the semiconductor die to a submount in a flip-chip configuration by way of the anode pad and the first cathode pad to form the optoelectronic device, wherein a free space is created directly between the second passivation layer and the submount.

13. The method of claim 12, further comprising forming an ohmic contact layer of the substrate layer, wherein the first conducting pad, the laser diode, and the second conducting pad are formed on the ohmic contact layer.

14. The method of claim 12, further comprising forming a dielectric layer on the substrate layer such that the dielectric layer separates the laser diode and the first passivation layer.

15. The method of claim 14, wherein forming each of the first conducting pad and the second conducting pad, comprises:
   forming an N metal layer on the substrate layer;
   forming a first seed metal layer on the N metal layer; and
   forming a first plated layer on the first seed metal layer, wherein to form the first conducting pad, the N metal layer is formed on a third side of the dielectric layer and to form the second conducting pad, the N metal layer is formed on a fourth side of the dielectric layer.

16. The method of claim 12, further comprising forming the first passivation layer in a region between (i) a first side of the laser diode and the first conducting pad, and (ii) a second side of the laser diode and the second conducting pad.

17. The method of claim 12, further comprising forming a second cathode pad on the second conducting pad, wherein the second passivation layer isolates the second cathode pad and the anode pad.

18. The method of claim 17, further comprising forming metal layers, wherein a first metal portion of the metal layers is formed on the first region of the first passivation layer, and a second metal portion of the metal layers is formed on the laser diode, wherein the first region of the first passivation layer is formed on the second conducting pad, and wherein the anode pad is formed on the first metal portion, and the second passivation layer is formed on the second metal portion.

19. The method of claim 18, wherein passage of heat occurs by way of a plurality of paths that comprise a first path, a second path, a third path, and a fourth path, wherein the first path is from a top of the laser diode into the metal layers and to the submount, the second path is from a bottom of the laser diode into the substrate layer such that the heat is radiated from the substrate layer, the third path is from the bottom of the laser diode into the substrate layer and to the submount by way of the first conducting pad and the first cathode pad, and the fourth path is from the bottom of the laser diode into the substrate layer and to the submount by way of the second conducting pad and the second cathode pad.

20. The method of claim 19, wherein the attaching the semiconductor die to the submount comprises:
   coating a first solder pad and a first solder trace on a first portion of the submount;
   coating a second solder pad and a second solder trace on a second portion of the submount; and
   flipping the semiconductor die to couple the anode pad to the first portion of the submount by way of the first solder pad and the first solder trace, and the first cathode pad to the second portion of the submount by way of the second solder pad and the second solder trace, wherein the free space separates the laser diode from the first solder pad and the second solder pad.

* * * * *